United States Patent
Kim

(10) Patent No.: US 10,424,749 B2
(45) Date of Patent: Sep. 24, 2019

(54) FOLDABLE DISPLAY DEVICE

(71) Applicant: LG Display Co., Ltd., Seoul (KR)

(72) Inventor: TaeWoo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/982,886

(22) Filed: May 17, 2018

(65) Prior Publication Data

US 2018/0351117 A1    Dec. 6, 2018

(30) Foreign Application Priority Data

May 31, 2017  (KR) .................. 10-2017-0068020

(51) Int. Cl.
*H01L 51/00* (2006.01)
*H01L 51/56* (2006.01)
*H01L 27/32* (2006.01)
*H01L 51/52* (2006.01)

(52) U.S. Cl.
CPC ...... *H01L 51/0097* (2013.01); *H01L 27/3251* (2013.01); *H01L 51/5253* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 2015/0314561 A1* | 11/2015 | Kim | B32B 37/1292 428/201 |
| 2017/0012202 A1* | 1/2017 | Izumi | B32B 7/06 |
| 2018/0151845 A1* | 5/2018 | Jeong | H01L 27/323 |

OTHER PUBLICATIONS

Bae, W.-G., et al., "Bio-inspired Smart Dry Adhesive Films and Their Applications," Polymer Science and Technology, Jun. 2011, pp. 230-236, vol. 22, No. 3.

* cited by examiner

*Primary Examiner* — J. E. Schoenholtz
(74) *Attorney, Agent, or Firm* — Fenwick & West LLP

(57) ABSTRACT

A flexible display device is provided according to the present disclosure. The flexible display device includes a display panel, a support frame configured to support the display panel and provide strength to the flexible display device, and an adhesive layer between the display panel and the support frame. The adhesive layer includes a base film with a first surface and a second surface opposite the first surface, first protuberances extending from the first surface towards the display panel and attaching to the display panel, and second protuberances extending from the second surface towards the support frame and attaching to the support frame.

21 Claims, 9 Drawing Sheets

FOLDABLE DISPLAY DEVICE

CROSS-REFERENCE TO RELATED APPLICATION

This application claims the priority of Korean Patent Application No. 10-2017-0068020 filed on May 31, 2017, in the Korean Intellectual Property Office, the disclosure of which is incorporated herein by reference.

BACKGROUND

Field

The present disclosure relates to a foldable display device.

Description of the Related Art

An image display device which implements various information on a screen is a core technology in an information communication era and is developing to be thinner, lighter, more portable, and has higher performance. Thus, an organic light emitting display device which controls an amount of emitted light of an organic light emitting element to display images is getting the spotlight.

The organic light emitting element is a self-emitting device using a thin light emitting layer between electrodes so that it can be manufactured to be thin. The normal organic light emitting display device has a structure in which a pixel driving circuit and an organic light emitting element are formed on a substrate and light emitted from the organic light emitting element passes through a substrate or a barrier layer to display images.

Since the organic light emitting display device is implemented without having a separate light source device, the organic light emitting display device may be easily implemented as a flexible, bendable, and foldable display device. In this case, a flexible material such as plastic or a metal foil is used for a substrate of the organic light emitting display device. Further, in the flexible and foldable display device, generally, a plurality of thin film layers is laminated on a substrate.

For example, the foldable display device may be configured by several functional films and a series of adhesive layers for lamination of the functional films. The foldable display device needs to be quickly restored to be flat in its original state after being folded and then unfolded. However, materials which are currently used have a limitation in complete restoration and such restoration characteristic is lowered under a high temperature or high humidity environment. Thus, in order to improve usability of the foldable display device, material and/or structural improvements for ensuring flexibility and restoration characteristic are demanded.

SUMMARY

Embodiments relate to a flexible display device including a display panel, a support frame configured to support the display panel and provide strength to the flexible display device, and an adhesive layer between the display panel and the support frame. The adhesive layer includes a base film with a first surface and a second surface opposite the first surface, first protuberances extending from the first surface towards the display panel and attaching to the display panel, and second protuberances extending from the second surface towards the support frame and attaching to the support frame.

According to an embodiment of the present disclosure, an electro luminance apparatus is provided. The electro luminance apparatus includes a base layer having one or more bending portions that can be bent, a support frame at one surface of the base layer, and an adhesive between the base layer and the support frame. The adhesive provides adhesion based on Van der Waals bonding of cilia structure.

According to an embodiment of the present disclosure, an apparatus is provided. The apparatus includes a thin film transistor (TFT) substrate with pixels used in displaying images, an upper substrate attached onto a front surface of the TFT substrate via a first adhesive layer, and a lower substrate attached onto a rear surface of the TFT substrate via a second adhesive layer. The lower substrate has a pliable region that cooperates with a corresponding portion of the second adhesive layer having a structure to allow flexibility to achieve a foldable, rollable or bendable display screen configuration.

According to the exemplary embodiments of the present disclosure, a support structure suitable for a dynamic behavior of a foldable display device may be provided. Further, according to the exemplary embodiments of the present disclosure, an adhesive member which enhances a structural firmness of the foldable display device may be provided. The effects according to the exemplary embodiments of the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION OF THE PREFERRED EMBODIMENTS

Figure 1:
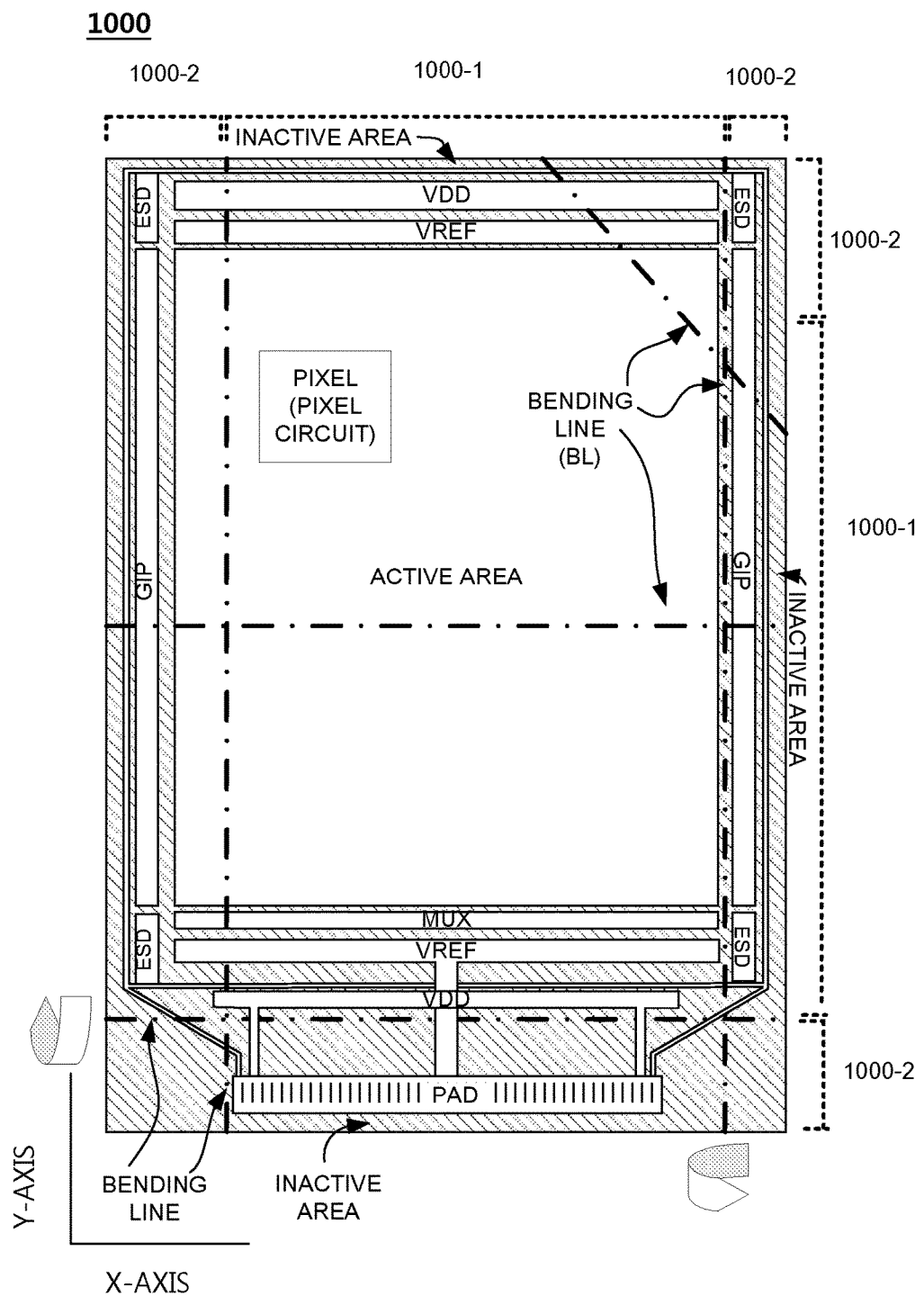
FIG. 1 illustrates an exemplary flexible display device which may be included in an electronic apparatus.

The features and characteristics of the present disclosure, and a method of achieving the advantages and characteristics will be better understood by referring to exemplary embodiments described below in detail together with the accompanying drawings. However, the present disclosure is not limited to the exemplary embodiments disclosed herein but will be implemented in various forms. The exemplary embodiments are provided by way of example only so that a person of ordinary skilled in the art can fully understand the disclosures of the present disclosure and the scope of the present disclosure. Thus, the present disclosure can be defined by the scope of the appended claims.

The shapes, sizes, ratios, angles, numbers, and the like illustrated in the accompanying drawings for describing the exemplary embodiments of the present disclosure are merely examples, and the present disclosure is not limited thereto.

Like reference numerals generally denote like elements throughout the specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise. Components are interpreted to include an ordinary error range even if not expressly stated.

When the positional relationship between two parts is described using the terms such as "on", "above", "below", and "next", one or more parts may be positioned between the two parts unless the terms are used with the term "immediately" or "directly". When an element or layer is disposed "on" another element or layer, another layer or another element may be interposed directly on the other element or therebetween. If it is described that a component is "connected" or "coupled" to another component, it is understood that the component is directly connected or coupled to the other component but other components may be "interposed" between each component, or each component may be "connected" or "coupled" through other components.

Although the terms "first", "second", and the like are used for describing various components, these components are not confined by these terms. These terms are merely used for distinguishing one component from the other components. Thus, a first component to be mentioned below may be a second component according to the technical concepts of the present disclosure.

A size and a thickness of certain components illustrated in the drawings are illustrated for the convenience of description, and the present disclosure is not limited to the size and the thickness of the component illustrated. Hereinafter, various exemplary embodiments of the present disclosure will be described in detail with reference to accompanying drawings.

FIG. 1 illustrates an exemplary flexible display device which may be included in an electronic apparatus.

The flexible display device refers to a display device with flexibility and may be used as the same meaning as a foldable display device, a bendable display device, a rollable display device, or an unbreakable display device. Referring to FIG. 1, the display device 1000 may include at least one active area. For example, the foldable display device may have a plurality of active areas which is divided into left and right (or up and down) with respect to an imaginary folding line. In the active area, an array of pixels is formed. One or more inactive areas may be disposed around the active area. That is, the inactive area may be adjacent to at least one side of the active area. In FIG. 1, the inactive area encloses a rectangular active area. However, a shape of the active area and a shape and an arrangement of the inactive area adjacent to the active area are not limited to an example illustrated in FIG. 1. The active area and the inactive area may have a shape suitable for a design of an electronic apparatus mounted with the display device 1000. An exemplary shape of the active area is a pentagon, a hexagon, a circle, or an oval.

Each pixel in the active area may be associated with a pixel circuit. The pixel circuit may include one or more switching transistors and one or more driving transistors on a backplane. Each pixel circuit may be electrically connected to a gate line and a data line in order to communicate with one or more driving circuits such as a gate driver and a data driver located in the inactive area.

The driving circuit may be implemented by one or more thin film transistors TFTs in the inactive area as illustrated in FIG. 1. The driving circuit may be referred to as a gate-in-panel GIP due to its placement on the panel itself. Further, some components such as a data driver IC (integrated circuit) are mounted on at least one printed circuit board and are coupled to a connecting interface (a pad/bump or a pin) disposed in the inactive area using a circuit film such as a flexible printed circuit board FPCB, a chip-on-film COF, or a tape-carrier-package TCP.

The flexible display device 1000 may include various additional elements to generate various signals or drive a pixel in the active area. The additional element which drives a pixel may include an inverter circuit, a multiplexer, or an electrostatic discharging circuit. The display device 1000 may further include an additional element associated with a function other than a pixel driving function. For example, the display device 1000 may include additional elements which provide a touch sensing function, a user authentication function (for example, fingerprint recognition), a multilevel pressure sensing function, or a tactile feedback function. The above-mentioned additional elements may be included in an external circuit which is connected to the inactive area and/or the connecting interface.

Several parts of the display device 1000 may be bent along the bending line BL. The bending line BL may extend horizontally (for example, an X direction of FIG.1), vertically (for example, a Y direction of FIG. 1), or diagonally. Thus, the display device 1000 may be bent or flexed in the combination of horizontal, vertical, and diagonal directions, based on a demanded design.

As mentioned above, one or more edges of the display device 1000 may be bent along the (imaginary) bending line BL. For example, the bending line BL is located to be close to the edge of the display device 1000. Further, the bending line BL may extend across the central portion 1000-1 or extend in a diagonal direction at one or more corners of the display device 1000. The structure may make the display device 1000 a foldable display or a display device in which image is displayed on both folded surfaces.

In some exemplary embodiments, a bending portion 1000-2 (or pliable region) of the flexible display device 1000 may include an active area in which images may be displayed. Such an active area is referred to as an auxiliary active area. That is, the bending line BL may be located in the active layer so that at least some pixels of the active area are included in the bending portion 1000-2.

Figure 2:
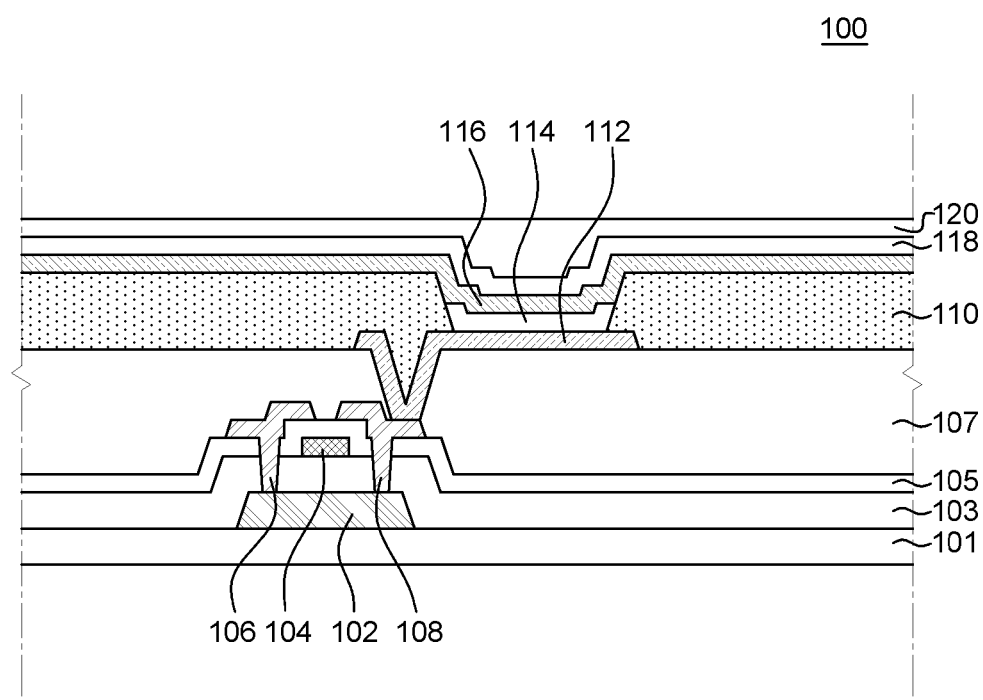
FIG. 2 is a cross-sectional view illustrating a part of a display panel included in a display device of the present disclosure.

FIG. 2 is a cross-sectional view illustrating a part of a display panel included in a display device of the present disclosure.

The display device 1000 may include a display panel 100 which displays images and various components (a frame or a case). Hereinafter, a flexible display device and a display panel will be described with an organic light emitting display panel as an example.

In the organic light emitting display panel 100, thin film transistors 102, 104, 106, and 108, organic light emitting elements 112, 114, and 116, and various functional layers are located on a base layer 101.

The base layer 101 supports various components of the organic light emitting display panel 100. The base layer 101 may be formed of a transparent insulating material, for example, an insulating material such as glass or plastic. A substrate (i.e. array substrate) may also include elements and functional layers formed on the substrate, for example, a switching TFT, a driving TFT connected to the switching TFT, an organic light emitting element connected to the driving TFT, and a passivation layer.

A buffer layer may be located on the base layer 101. The buffer layer is a functional layer for protecting the thin film transistor TFT from impurities such as alkali ions which are leaked from the base layer 101 or layers therebelow. The buffer layer may be formed of silicon oxide SiOx, silicon nitride SiNx, or multiple layers thereof.

The thin film transistor is disposed on the base layer 101 or the buffer layer. The thin film transistor may be formed such that a semiconductor layer 102, a gate insulating layer 103, a gate electrode 104, an interlayer insulating layer 105, source and drain electrodes 106 and 108 are sequentially disposed. The semiconductor layer 102 is located on the base layer 101 or the buffer layer. The semiconductor layer 102 may be made of poly silicon (p-SI). In this case, a predetermined region may be doped with impurities. Alternatively, the semiconductor layer 102 may be made of amorphous silicon (a-Si) or various organic semiconductor materials such as pentacene. Otherwise, the semiconductor layer 102 may be made of oxide. The gate insulating layer 103 may be formed of an insulating inorganic material such as silicon oxide SiOx or silicon nitride SiNx or an insulating organic material. The gate electrode 104 may be formed of various conductive materials, for example, magnesium (Mg), aluminum (Al), nickel (Ni), chrome (Cr), molybdenum (Mo), tungsten (W), gold (Au), or an alloy thereof.

The interlayer insulating layer 105 may be formed of an insulating material such as silicon oxide SiOx or silicon nitride SiNx or an insulating organic material. The interlayer insulating layer 105 and the gate insulating layer 103 are selectively removed to form a contact hole through which the source and drain regions are exposed.

The source and drain electrodes 106 and 108 are formed on the interlayer insulating layer 105 in the form of a single layer or multiple layers as an electrode material.

A planarization layer 107 may be located on the thin film transistor. The planarization layer 107 protects the thin film transistor and planarizes (i.e. provides flatness to) an upper portion thereof. The planarization layer 107 may be configured to have various shapes. The planarization layer may be modified in various ways, for example, the planarization layer 107 may be formed of an organic insulating film such as benzocyclobutene (BCB) or acryl or an inorganic insulating film such as a silicon nitride film (SiNx) or a silicon oxide layer (SiOx) or may be formed of a single layer or double layers or multiple layers.

The organic light emitting element may be formed such that a first electrode 112, an organic light emitting layer 114, and a second electrode 116 are sequentially disposed. That is, the organic light emitting element may include the first electrode 112 formed on the planarization layer 107, the organic light emitting layer 114 located on the first electrode 112, and the second electrode 116 located on the organic light emitting layer 114.

The first electrode 112 is electrically connected to the drain electrode 108 of the driving thin film transistor through the contact hole. When the organic light emitting display panel 100 is a top emission type, the first electrode 112 may be formed of an opaque conductive material having high reflectance. For example, the first electrode 112 may be formed of silver (Ag), aluminum (Al), gold (Au), molybdenum (Mo), tungsten (W), chrome (Cr), or an alloy thereof.

The bank 110 is formed in a remaining area except for a light emitting area. The bank 110 has a bank hole or opening which exposes the first electrode 112 corresponding to the light emitting area. The bank 110 may be made of an inorganic insulating material such as a silicon nitride film (SiNx) or a silicon oxide film (SiOx) or an organic insulating material such as BCB, acrylic resin or imide resin.

The organic light emitting layer 114 is located on the first electrode 112 which is exposed by the bank 110. The organic light emitting layer 114 may include a light emitting layer, an electron injection layer, an electron transport layer, a hole transport layer, and a hole injection layer. These layers may be distinct or some of their functions may be combined into the same layer. The organic light emitting layer may be configured by a single light emitting layer structure which emits a single type of light or may be configured by a structure which is configured by a plurality of light emitting layers to collectively emit white light.

The second electrode 116 is located on the organic light emitting layer 114. When the organic light emitting display panel 100 is a top emission type, the second electrode 116 is formed of a transparent conductive material such as indium tin oxide ITO or indium zinc oxide IZO to emit light generated in the organic light emitting layer 114 to an upper portion of the second electrode 116.

A passivation layer 118 and an encapsulation layer 120 may be located on the second electrode 116. The passivation layer 118 and the encapsulation layer 120 block penetration of oxygen and moisture to prevent undesirable oxidation of a light emitting material and an electrode material. When the organic light emitting element is exposed to moisture or oxygen, a pixel shrinkage phenomenon in which the light emitting area is reduced may occur or dark spots is may be undesirably formed in the light emitting area. The passivation layer and/or the encapsulation layer may include an inorganic film formed of glass, metal, aluminum oxide AlOx or a silicon based material or may have a structure in which organic films and inorganic films are alternately laminated. The inorganic film serves to block the penetration of moisture or oxygen and the organic film serves to planarize a surface of the inorganic film. The reason why the encapsulation layer is formed of several thin film layers is to create a longer and more complex propagation path for moisture or oxygen when compared to that of a single layer to thus make it much more difficult for moisture and oxygen to penetrate into the organic light emitting element.

The organic light emitting display panel 100 may further include a touch layer, a polarization layer, and a cover layer on the encapsulation layer 120.

Figure 3A:
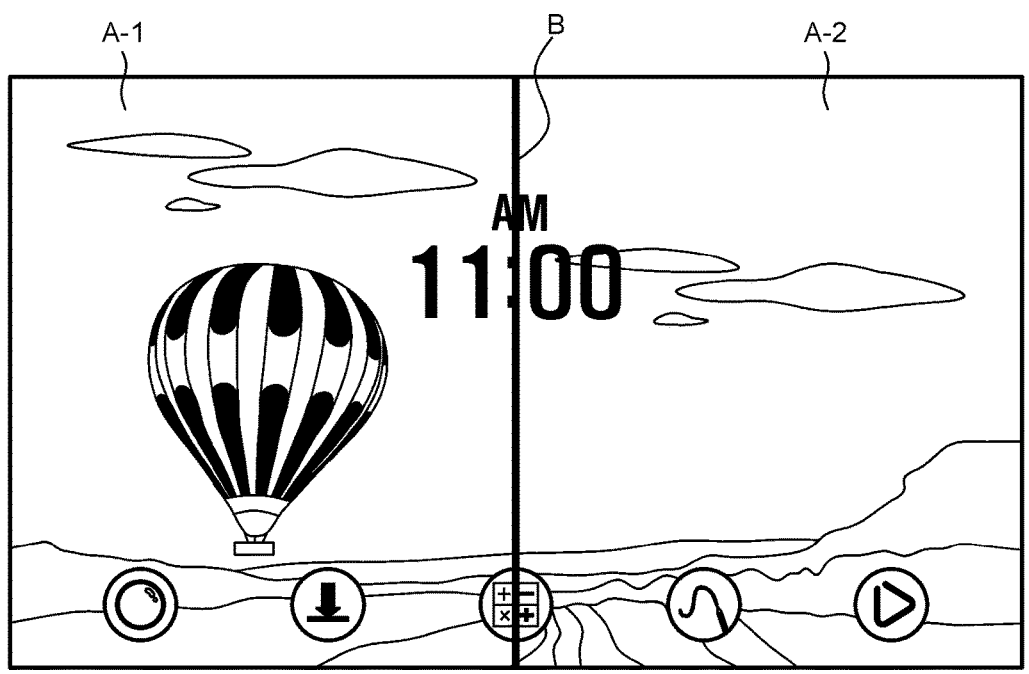
FIGS. 3A and 3B are views for explaining a foldable display device according to an exemplary embodiment of the present disclosure.
Figure 3B:
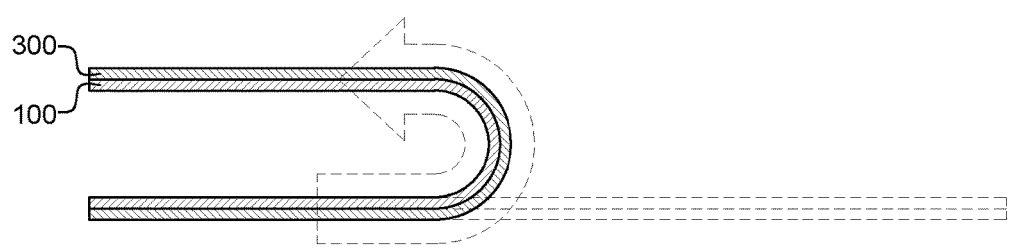

FIGS. 3A and 3B are views for explaining a foldable display device according to an exemplary embodiment of the present disclosure.

Generally, a foldable display device may include a plurality of thin film layers and an adhesive which bonds together the plurality of thin film layers. Due to material properties and limitations, there are many parts that need to be improved, such as a folding radius, repeated folding and/or maintenance of a flatness during a long-term storage in a folded state. For example, the foldable display device needs an appropriate neutral plane design, and thus it is difficult to use an adhesive having a modulus of elasticity (for example, Young's modulus) having a predetermined value or higher. Further, wet-type adhesives are subject to strain caused by bending in a foldable display device. As the bending is repeated, the adhesive becomes less elastic and therefore may not revert back to its original shape due to plastic deformation. Further, a flexible substrate based display panel which is mainly used for the foldable display device has a weak stiffness so that a stronger protecting (or supporting) member is necessary. When such a protecting member and the display panel are formed to be integrated, there may be a problem with respect to surface waviness or restoration characteristics of the entire foldable display device.

The present disclosure relates to a foldable display device structure which can reduce a folding radius and reduce several problems according to repeated folding and unfolding, when compared to a conventional foldable display device. As illustrated in FIG. 3A, the foldable display device may include two or more active areas A-1 and A-2 and a folding area B therebetween, and may be folded as illustrated in FIG. 3B. In FIG. 3A, only two active areas are illustrated, but an actually implemented product may be configured to have two or more active areas. A pixel matrix in the second active area A-2 may continuously extend from the first active area A-1. Otherwise, in FIG. 3A, the first active area and the second area may be separated from each other with the folding area therebetween. Some components of the first active area and the second active area may be electrically connected through one or more conducting lines (e.g. wires, traces, etc.) located across the folding area. A pixel of the first active area A-1 and a pixel of the second active area A-2 may be driven by a driving circuit (for example, a gate driver or a data driver) as if the pixels are on the same matrix. In this case, the pixel of the first active area A-1 and the pixel of the second active area A-2 operate by the same driving circuits. For example, a pixel in an N-th row of the first active area A-1 and a pixel in an N-th row of the second active area A-2 may be received a gate signal from the same gate driver. According to an implemented example, the pixel of the second active area A-2 may be separately driven from the pixel of the first active area A-1. That is, the pixel of the second active area A-2 may be recognized by the driving circuit as an independent matrix which is separated from a matrix of a pixel of the first active area A-1. In this case, the pixel of the second active area A-2 may receive a signal from one or more driving circuits which are separated from a driving circuit which supplies a signal to the pixel of the first active area A-1. In the meantime, regardless of its shape, the second active area A-2 may serve as a secondary active area of the foldable display panel 100. Further, a size ratio of the first active area A-1 to the second active area A-2 is not specifically limited.

In the foldable display device 1000 which is folded (or bent) as illustrated in FIG. 3B, it is important to design a support member 300 that does not to apply excessive compressive force or tensile force to the display panel 100. Further, an adhesive member which couples the support member 300 and the display panel 100 should have characteristics to maintain flatness of the foldable display device 1000 and/or quickly restore the shape. In FIG. 3B, even though an inward foldable display device is illustrated, the above-described importance is the same in an outward foldable display device which is folded in an opposite direction.

Figure 4A:
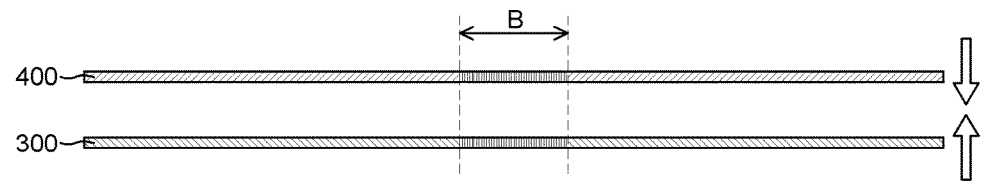
FIGS. 4A and 4B are cross-sectional views illustrating a foldable display device according to an exemplary embodiment of the present disclosure.
Figure 4B:
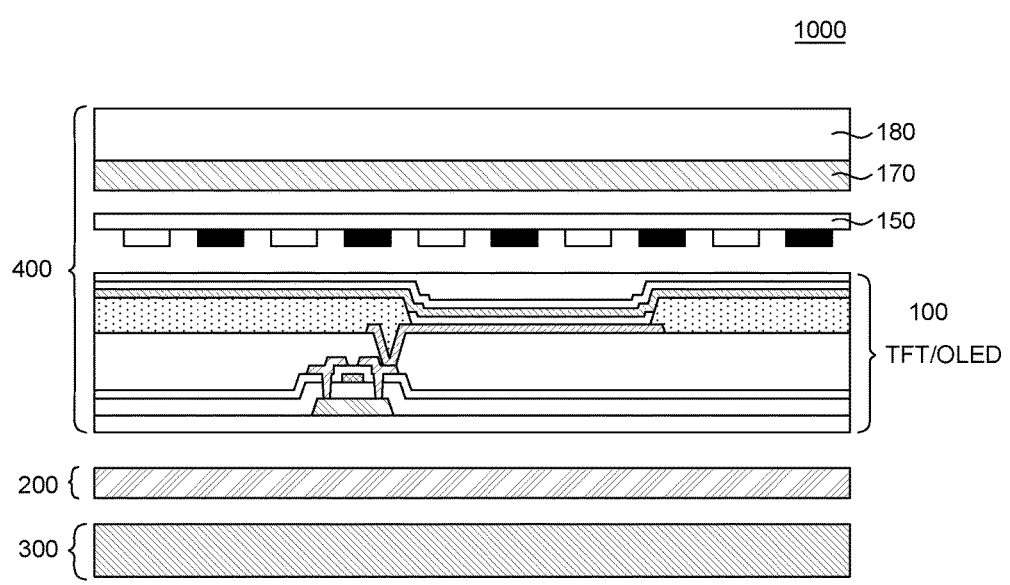

FIGS. 4A and 4B are views for illustrating a foldable display device according to an exemplary embodiment of the present disclosure.

As illustrated in FIG. 4A, the foldable display device 1000 may have a structure in which the display panel 400 and a support frame 300 are bonded or attached together. The foldable display device 1000 includes two or more active areas and a folding area B between the active areas and the folding area B may have a structure which reduces deformation due to repeated folding and unfolding. As illustrated in FIG. 4B, the display panel 400 may have a structure in which an organic light emitting element layer TFT/OLED (e.g., display panel 100 as shown in FIG. 2), a touch panel 150, a polarization layer 170, and a cover layer 180 are laminated. A support layer 300 may be located below the organic light emitting element layer TFT/OLED.

The organic light emitting element layer TFT/OLED is disposed on one surface (first surface) of the base layer 101. The base layer 101 has a first active area A-1, a second active area A-2, and a folding area B between the first area and the second area. Since a width of the folding area (i.e. center bezel) is related to a folding radius, the width may be determined based on the desired folding radius and designed in consideration of an encapsulation margin. The folding area B may be understood as a sum of an actually folded part and the encapsulation margin. When the base layer 101 is formed of plastic, the base layer may be referred to as a plastic film or a plastic substrate. For example, the base layer 101 may be a film type made of a material selected from a group consisting of polyimide polymer, polyester polymer, silicon polymer, acrylic polymer, polyolefin polymer, and a copolymer thereof. Among the above-mentioned materials, polyimide may be applied to a high temperature process and may be easily coated, and thus polyimide can be frequently used for the plastic substrate.

The organic light emitting element layer TFT/OLED may include a TFT backplane and an organic light emitting diode. The TFT backplane is implemented on the base layer 101. In some exemplary embodiments, the backplane may be implemented together with a TFT in which a low temperature polysilicon (LTPS) semiconductor layer is used as an active layer. In an example, the pixel circuits and the driving circuits (for example, GIP) on the base layer 101 may be implemented by NMOS LTPS TFTs. In another example, the TFT backplane may be implemented by a combination of NMOS LTPS TFT and PMOS LTPS TFT. For example, the driving circuit (for example, GIP) on the base layer 101 may include one or more CMOS circuits to reduce the number of wiring lines for controlling a scan signal on the gate line. In some exemplary embodiments, the TFT backplane may be implemented by various different types of TFTs. That is, in order to implement the TFT backplane, a combination of an oxide semiconductor TFT and the LTPS TFT may be used. In the TFT backplane, a type of the TFT may be selected according to an operating condition and/or a TFT requirement condition in a related circuit.

The organic light emitting diode is disposed on the TFT backplane. The organic light emitting diode is controlled by a pixel circuit and a driving circuit implemented on the base layer 101 and other external driving circuit connected to a connecting interface on the base layer 101. The organic light emitting diode includes an organic light emitting material layer which emits light of a specific color (for example, red, green, blue, white, yellow, cyan, etc.). In some exemplary embodiments, the organic light emitting material may have a laminated structure which may emit white light (essentially, a combination of light of several colors).

In order to increase strength and/or firmness in a specific part of the foldable display device 1000, one or more support layers may be provided below the base layer 101. The support layer is attached to an opposite surface (a second surface) to a surface (a first surface) on which the organic light emitting element is provided, among both surfaces of the base layer 101. The support layer may be made of a plastic thin film made of polyethylene naphthalate (PEN), ployethylene terephthalate (PET), polyethylene ether phthalate, polycarbonate, polyarylate, polyether imide, polyether sulfonate, polyimide, polyacrylate, and a combination of other appropriate polymers. Other appropriate materials used for forming the support layer may be thin glass, metal foil shielded by a dielectric material, multilayered polymer, or a polymer film including a polymer material combined with nano-particles or micro-particles. The support layer may be a porous film having through holes or openings provided in a vertical direction (a direction parallel to a lamination direction of the base layer 101 and the support layer). The through holes may be provided only in the folding area (a portion corresponding to B in FIG. 4A). In another exemplary embodiment, the through holes may be provided in a portion corresponding to any one or more of the first active area and the second active area. Such a structure may contribute to preventing or reducing undesired permanent deformation due to repeated folding.

As illustrated in FIG. 4B, a touch panel 150 for sensing a touch input of the user may be formed on an upper surface (for example, an upper surface of the encapsulation layer) of the organic light emitting element layer TFT/OLED. If necessary, another independent layer equipped with a touch sensing electrode and/or other components associated with touch input sensing may be provided in the display panel 400. The touch sensing electrode (for example, a touch driving/sensing electrode) may be formed of a transparent conductive material such as indium tin oxide (ITO), a carbon based material such as graphene, carbon nanotubes, a conductive polymer, or a hybrid material made of a mixture of various conductive/non-conductive materials. Further, a metal mesh-like structure, for example, aluminum mesh or silver mesh may also be used for the touch sensing electrode.

The cover layer 180 may be used to protect an upper portion of the display panel 400. The cover layer 180 may be cover glass element or other protective member. A polarization layer which controls a particular display characteristic (for example, external light reflection, color accuracy, or brightness) may be located on one surface of the cover layer 180. As an implemented example, as illustrated in FIG. 4B, the polarization layer 170 may be coated on a lower (or inner) surface of the cover layer 180.

Since the folding area B is most affected by so-called bending stress, several stress reducing structures may be applied to components on the folding area. To this end, a few or many of the components in the active area may be omitted in at least a part of the folding area B in order to minimize such bending stress. For example, in the folding area, the organic light emitting element (for example, a pixel circuit and an organic light emitting diode) may be omitted. Further, only a minimum number of layers can be disposed in the folding area. For example, in the folding area B, only the base layer, the organic layer above the base layer, and the cover layer on the organic layer are disposed to reduce potential bending stress. Further, in the folding area B, an inorganic layer patterned between the base layer and the organic layer may be further disposed. The inorganic layer may act as a buffer layer. Various types of patterning may be implemented by a series of etching processes. The pattern may be a stripe pattern having stripe segments parallel to a folding axis and a pitch therebetween may be designed in consideration of the desired bending radius.

The support frame 300 is located on one surface of the display panel 400 and serves to support the display panel 400. As illustrated in FIG. 4B, the support frame 300 may cover an outer surface of the display panel 400 at a rear side of a screen displaying direction. The support frame 300 may be made of silicon or metal.

The adhesive layer 200 is a layer located between the display panel 400 and the support frame 300 and bonds the display panel 400 to the support frame 300. The adhesive layer 200 can have a micro/nano cilia structure, in which micro-sized or nano-sized protuberances (i.e. cilia, projections, ancillary members, etc.) are formed on its surface. The adhesive layer 200 includes several to millions of micro/nano cilia structures similar to fiber bundles and adheres the display panel 400 to the support frame 300 based on Van der Waals bonding effects. The adhesive layer 200 can be made of a dry adhesive based on the micro/nano cilia structure. By doing this, the adhesive layer 200 may overcome or reduce the problems caused when the above-described wet adhesive is applied to the foldable display device. The adhesive layer 200 will be described in more detail below.

Figure 5A:
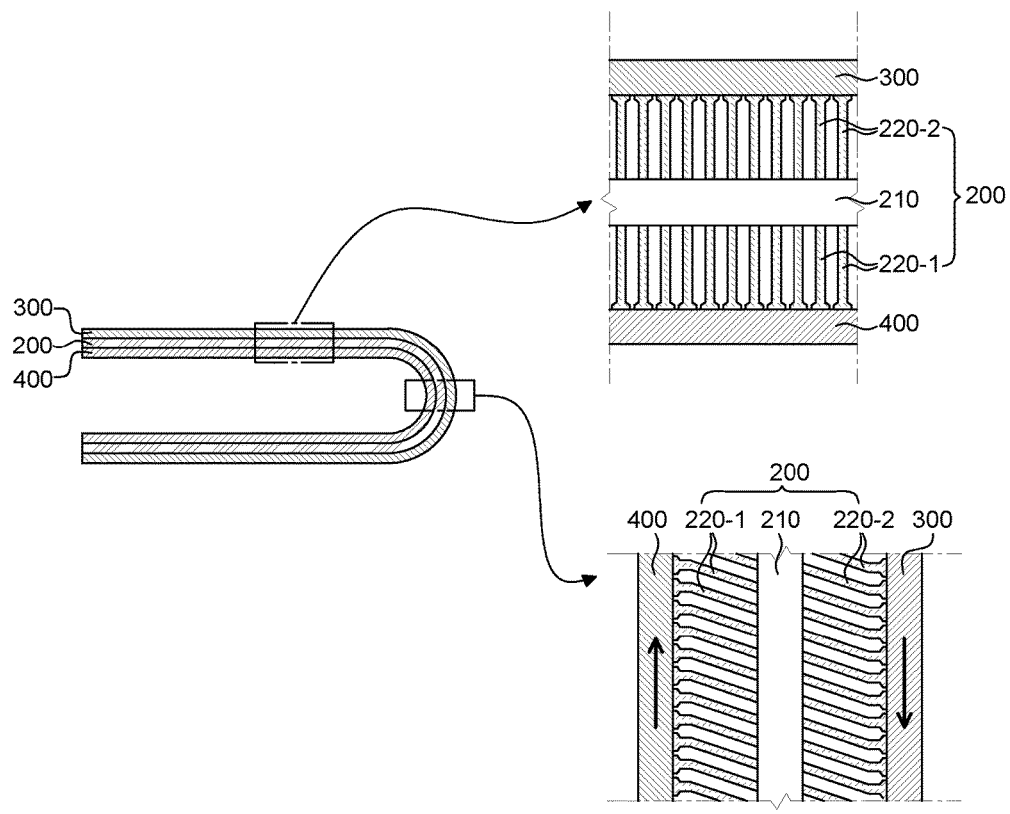
FIGS. 5A, 5B, and 5C are views for explaining an adhesive layer applied to a foldable display device according to an exemplary embodiment of the present disclosure.
Figure 5B:
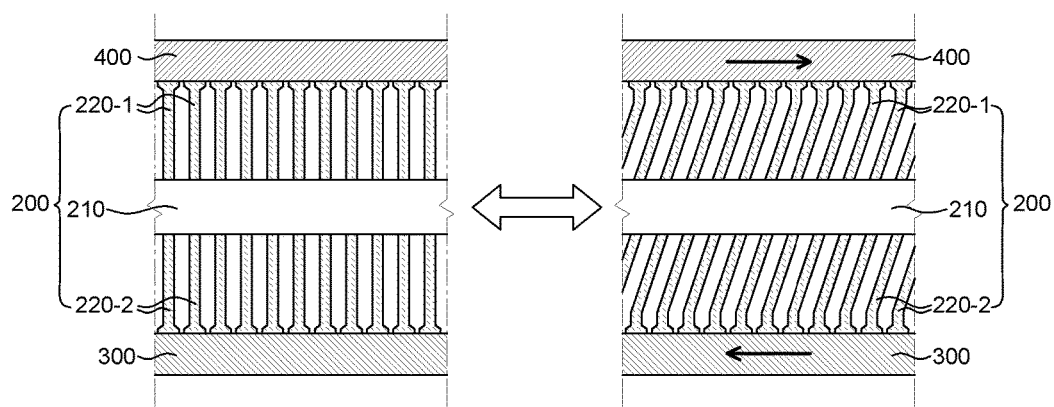
Figure 5C:
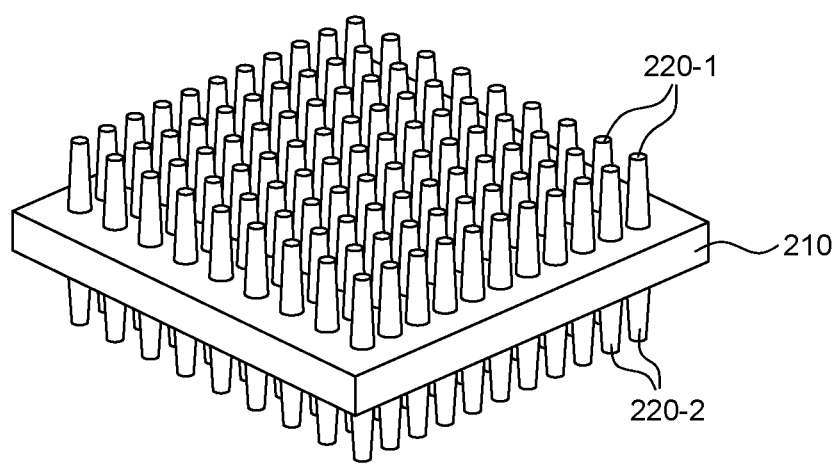

FIGS. 5A to 5C are conceptual drawings for explaining an adhesive layer applied to a foldable display device according to an exemplary embodiment of the present disclosure.

As described above, the adhesive layer 200 can be a dry adhesive layer which is adhered to the display panel 400 and the support frame 300 based on the Van der Waals bonding. Such Van der Waals bonding is a relatively weak type of bonding based upon the principle in which when two atoms closely approach each other, fluctuation occurs in an electron cloud surrounding a nucleus of each atom and thus weak electrostatic attraction is generated such that two atoms exhibit adhesive forces. Even though electrostatic attraction between two atoms is weak, if there is a plurality (for example, millions) of micro/nano protuberances and ends of such protuberances are divided into several branches, the attractions thereof are concentrated such that the overall bonding force become significantly high. From nature, various types of cilia structure having the strong adhesive force, a high aspect ratio structure, a slanted structure, a spatulate head structure having a wide end, and a hierarchical structure can be found. Based on this observation, a cilia structure having strong adhesive force is applied for the inventive concepts described herein to the adhesive layer of the display panel and the support frame.

In one exemplary embodiment of the present disclosure, the adhesive layer 200 has a micro/nano cilia structure on both the upper and lower surfaces for increasing adhesion, similar to a double-sided tape. That is, as illustrated in FIGS. 5A and 5B, the adhesive layer 200 may have a micro/nano cilia structure which includes a base film 210 having a first surface and a second surface opposite to the first surface, first protuberance 220-1 on the first surface, and second protuberance 220-2 on the second surface. In this case, the first protuberance 220-1 is adhered to an object which faces the first surface and the second protuberance 220-2 is adhered to an object which faces the second surface. In one embodiment, the first protuberance 220-1 may extend from the first surface of the base film 210 towards the display panel 400. The second protuberances 220-2 may extend from the second surface of the base film 210 to the support frame 300. The base film 210 may be a thin film which is formed of polymer such as polyimide and has a thickness of approximately 2 to 10 μm. The first protuberance 220-1 and the second protuberance 220-2 may be coated or imprinted on the base film 210 by using various methods.

In FIGS. 5A and 5B, the first protuberance 220-1 and the second protuberance 220-2 are adhered to the display panel 400 and the support frame 300, respectively, based on the Van der Waals bonding. The first protuberance 220-1 and the second protuberance 220-2 are adhered to the display panel 400 and the support frame 300, in a vertical direction to the base film or in a slanted state at a predetermined angle from the vertical direction to the base film.

The first protuberance 220-1 and the second protuberance 220-2 may be made of polymer or materials having excellent restoring force, such as silicon based elastomer or carbon nano tube. The first protuberance 220-1 and the second protuberance 220-2 may have various shapes and characteristics to ensure an appropriate adhesive strength.

Aspect ratios of the first protuberance 220-1 and the second protuberance 220-2 may be 5 to 50. The aspect ratio herein refers to a ratio of a vertical length of the protuberance to a horizontal length of the protuberance (e.g., diameter). In one embodiment, the first protuberances 220-1 and the second protuberances 220-2 may have an aspect ratio greater than 5, and a vertical length of the first protuberances 220-1 and the second protuberances 220-2 may have a vertical length of at least 1 micrometer. For example, the first protuberance 220-1 and the second protuberance 220-2 may have a diameter (a horizontal length) of 100 to 200 nm and a length (a vertical length) of 1 to 5 μm. The size of protuberance may be determined in consideration of a total thickness of the adhesive layer and the number of protuberance for unit area. Namely, the specific dimensions (e.g., shape, length, width, height, thickness, packed density, etc.) of the first and second protuberance 220-1, 220-2 may vary with respect to the overall size of the foldable display device and how the folding (i.e., inward folding, outward folding, both, etc.) or otherwise pliable movement action should be achieved. In other words, the adhesive layer 200 has a structure that includes a double-sided dry adhesive with micro-scale or nano-scale surface treatment that permits lateral displacement of at least the display panel 11 (i.e. TFT substrate) and the support frame 300 (i.e. lower substrate) with respect to each other. Here, the surface treatment can include micro-sized or nano-sized pores or cilia-like protuberances created by imprinting, plasma etching, or other appropriate manufacturing method.

As another example, the first protuberance 220-1 and the second protuberance 220-2 may further include an adhesive strength enhancing layer, for example, a wet adhesive or a metal (for example, platinum) layer at a terminal (an end portion) which is adhered to the display panel 400 and the support frame 300. For example, the adhesive enhancing layer may be between first ends of the first protuberances 220-1 at an opposite side of the base film 210, and the display panel. The adhesive enhancing layer may be between second ends of the second protuberances 220-2 at an opposite side of the base film 210, and the support frame 300. These materials may further increase the adhesive strength with the display panel 400 and the support frame 300.

As still another example, in the first protuberance 220-1 and the second protuberance 220-2, the end portions, which are adhered to the display panel 400 and the support frame 300, may be wider than their other portions (for example, a spatulate shape). For example, display ends of the first protuberances 220-1 attached to the display panel 400 are wider than base ends of the first protuberances 220-1 attached to a first surface of the base film 210, and support ends of the second protuberances 220-2 attached to the support frame 300 are wider than base ends of the second protuberances 220-2 attached to a second surface of the base film. Further, during a process of generating the first protuberance 220-1 and the second protuberance 220-2, a processing (for example, trimming or plasma etching) may be performed to widen a cross-sectional area of an end portion (terminal) of protuberance. As still another example, in the first protuberances 220-1 and the second protuberances 220-2, the end portions which are adhered to the display panel 400 and the support frame 300 may be divided into a plurality of branches. For example, display ends of the first protuberances 220-1 attached to the display panel 400 are divided into branches from base ends of the first protuberances 220-1 attached to a first surface of the base film 210, and support ends of the second protuberances 220-2 attached to the support frame 300 are divided into branches from base ends of the second protuberances 220-2 attached to a second surface of the base film. The formation of such so-called spatulate shapes (i.e. having wider end portions, having more branches, etc.) can be achieved by applying certain types of mechanical processing, chemical reaction processing, or both.

When there is a folding deformation in the foldable display device, the protuberance of the adhesive layer 200 are adapted to the movement of the adhered structure. That is, in an area where the foldable display device is folded, the display panel 400 and the support frame 300 behave or react in opposite directions. In this case, when viewed from its cross-section, the first protuberance 220-1 and the second protuberance 220-2 are slanted in opposite directions in accordance with moving or displacement directions of the display panel 400 and the support frame 300. In one embodiment, responsive to bending the display panel 400, the support frame 300, and the adhesive layer 200, the first protuberances 220-1 and the second protuberances 220-2 tilt relative to the first surface or the second surface of the base film 210 in a bending region of the adhesive layer. Such a movement of the first protuberance 220-1 and the second protuberance 220-2 relieves the stress which is applied to the adhesive layer 200 upon folding or unfolding of the display device. Moreover, the deformation of the adhesive layer 200 is not fixed because of the space or leeway provided by the cilia structure. Thus, the foldable display device according to the present disclosure may be easily restored in its original shape when it is folded and then unfolded. As described above, the adhesive layer 200 according to the embodiments of the present disclosure may solve various problems (e.g., deformation) that occur when a conventional wet adhesive is applied to the foldable display device. The adhesive layer 200 may retain its elasticity when it is subject to repeated bending.

FIG. 5C is a perspective view of the adhesive layer 200 according to an embodiment of the present disclosure. As described above, the adhesive layer 200 in FIG. 5C includes cilia 220-1 and 220-2 arranged with specific pattern or randomly on upper and lower surface of the base film 210. That is, the adhesive layer 200 may have a base film 210, first cilia 220-1 on the first surface of the base film 210, and second cilia 220-2 on the second surface of the base film 210. The first cilia 220-1 and the second cilia 220-2 may be coated or imprinted on the base film 210. For example, the first cilia 220-1 and the second cilia 220-2 may be printed on the base film 210 by using roller type mold. In this case, the first cilia 220-1 and the second cilia 220-2 may have a shape that is easily removable from a mold. Further, the first cilia 220-1 and the second cilia 220-2 may be made so that they have at least one of a high aspect ratio structure, a slanted structure, a spatulate head structure having a wide end, and a hierarchical structure. A slanted structure herein refers to the first cilia 220-1 and/or the second cilia 220-2 are formed at an angle relative to a surface of the base film 210. A hierarchical structure herein refers to the first cilia 220-1 and/or the second cilia 220-2 having a smaller structure at an end of the first cilia 220-1 and/or the second cilia 220-2 opposite the base film 210. A smaller structure may be a surface roughness of an end of the first cilia 220-1 and/or the second cilia 220-2. A smaller structure may be a group of smaller protrusions extending from an end of the first cilia 220-1 and/or the second cilia 220-2.

Although the exemplary embodiments of the present disclosure have been described in detail with reference to the accompanying drawings, the present disclosure is not limited thereto and may be embodied in many different forms without departing from the technical concept of the present disclosure. Thus, the exemplary embodiments of the present disclosure are provided for illustrative purposes only but not intended to limit the technical concept of the present disclosure. The scope of the technical concepts of the present disclosure is not limited thereto. The features of various embodiments of the present disclosure can be partially or entirely bonded to or combined with each other and can be interlocked and operated in technically various ways by those skilled in the art, and the embodiments can be carried out independently of or in association with each other. The protective scope of the present disclosure should be construed based on the following claims, and all the technical concepts in the equivalent scope thereof should be construed as falling within the scope of the present disclosure.

What is claimed is:

1. A flexible display device comprising:
   a display panel;
   a support frame configured to support the display panel and provide strength to the flexible display device; and
   an adhesive layer between the display panel and the support frame, the adhesive layer including:
      a base film with a first surface and a second surface opposite the first surface,
      first protuberances extending from the first surface towards the display panel and attaching to the display panel, and
      second protuberances extending from the second surface towards the support frame and attaching to the support frame.

2. The flexible display device of claim 1, wherein the first protuberances and the second protuberances have an aspect ratio greater than 5 corresponding to a vertical length of the first protuberances and the second protuberances of at least 1 micrometer.

3. The flexible display device of claim 1, wherein the first protuberances and the second protuberances are made of at least one of a polymer and a carbon nanotube.

4. The flexible display device of claim 1, wherein display ends of the first protuberances attached to the display panel are wider than base ends of the first protuberances attached to the first surface of the base film, and support ends of the second protuberances attached to the support film are wider than base ends of the second protuberances attached to the second surface of the base film.

5. The flexible display device of claim 1, wherein display ends of the first protuberances attached to the display panel are divided into a plurality of branches from base ends of the first protuberances attached to the base film, or support ends of the second protuberances attached to the support film are divided into a plurality of branches from base ends of the second protuberances attached to the base film.

6. The flexible display device of claim 1, further comprising an adhesive enhancing layer between first ends of the first protuberances at an opposite side of the base film, and the display panel, or between second ends of the second protuberances at an opposite side of the base film, and the support frame.

7. The flexible display device of claim 6, wherein the adhesive enhancing layer is at least one of a wet adhesive or a metal layer.

8. The flexible display device of claim 1, wherein responsive to bending the display panel, the support frame and the adhesive layer, the first protuberances and the second protuberances are configured to tilt relative to the first surface or the second surface of the base film in a bending region of the adhesive layer.

9. An electro luminance apparatus comprising:
   a base layer having one or more bending portions that can be bent;
   a support frame at one surface of the base layer; and
   an adhesive between the base layer and the support frame, the adhesive providing adhesion based on Van der Waals bonding of cilia structure.

10. The electro luminance apparatus of claim 9, wherein the adhesive reduces stress caused by difference in deformation in the base layer and the support frame when the base layer and the support frame are folded.

11. The electro luminance apparatus of claim 9, wherein the adhesive includes:
   a base film having a first surface facing towards the base layer and a second surface opposite to the first surface, the second surface facing the support frame;
   a first cilia of the cilia structure on the first surface; and
   a second cilia of the cilia structure on the second surface.

12. The electro luminance apparatus of claim 11, wherein the first cilia and the second cilia are adhered to the base layer and the support frame, the first cilia and the second cilia are slanted at an angle relative to the first surface or the second surface in a bending region of the electro luminance apparatus.

13. The electro luminance apparatus of claim 11, wherein aspect ratios of the first cilia and the second cilia are 5 to 50.

14. The electro luminance apparatus of claim 9, further comprising:
   a thin film transistor on said base layer;
   an organic light emitting element on said thin film transistor; and
   an encapsulation layer on said organic light emitting element.

15. A method of manufacturing a flexible display device comprising:
   attaching a display panel of the flexible display device to first protuberances of an adhesive layer extending from a surface of a base film of the adhesive layer; and
   attaching a support frame of the flexible display device to second protuberances of the adhesive layer extending from another surface of the base film,
   wherein bending of the display panel, the support frame and the adhesive layer, cause the first protuberances and the second protuberances to tilt relative to the surface or the other surface of the base film in a bending region of the adhesive layer.

16. The method of claim 15 further comprising:
   forming the first protuberances and the second protuberances on the base film by at least one of coating and imprinting the first and second protuberances on the base film.

17. The method of claim 15 further comprising:
   trimming first ends of the first protuberances at an opposite side of the base film to increase widths of the first ends;
   trimming second ends of the second protuberances at an opposite side of the base film to increase widths of second ends.

18. The method of claim 15 further comprising:
   plasma etching first ends of the first protuberances at an opposite side of the base film to increase widths of the first ends; and plasma etching ends of the second protuberances at an opposite side of the base film to increase widths of the second ends.

19. The method of claim 15 further comprising:

dividing ends of the first protuberances at an opposite side of the base film into a plurality of branches from ends of the first protuberances attached to the base film;

dividing ends of the second protuberances at an opposite side of the base film into a plurality of branches from ends of the second protuberances attached to the base film.

20. An apparatus comprising:

a thin film transistor (TFT) substrate with pixels used in displaying images;

an upper substrate attached onto a front surface of the TFT substrate via a first adhesive layer; and a lower substrate attached onto a rear surface of the TFT substrate via a second adhesive layer, the lower substrate with a pliable region that cooperates with a corresponding portion of the second adhesive layer having a structure to allow flexibility to achieve a foldable, rollable or bendable display screen configuration, wherein the structure includes a double-sided dry adhesive with micro-scale or nano-scale surface treatment that permits lateral displacement of at least the TFT substrate and the lower substrate with respect to each other.

21. The apparatus of claim 20, wherein the surface treatment includes micro-sized or nano-sized pores or cilia-like protuberances created by imprinting or plasma etching.

\* \* \* \* \*